United States Patent [19]
Chang

[11] Patent Number: 5,942,777
[45] Date of Patent: Aug. 24, 1999

[54] MEMORY DEVICE INCLUDING A MEMORY ARRAY HAVING A COMBINATION OF TRENCH CAPACITOR DRAM CELLS AND STACKED CAPACITOR DRAM CELLS

[75] Inventor: Augustine Wei-Chun Chang, San Jose, Calif.

[73] Assignee: Sun Microsystems, Inc., Palo Alto, Calif.

[21] Appl. No.: 09/073,039

[22] Filed: May 5, 1998

[51] Int. Cl.$^6$ .................................................. H01L 27/108
[52] U.S. Cl. .......................... 257/296; 257/301; 257/303; 257/306; 257/307; 257/905
[58] Field of Search .................... 257/296, 298, 257/301, 303, 305, 306, 307, 905; 365/149, 182

[56] References Cited

U.S. PATENT DOCUMENTS

| | | | |
|---|---|---|---|
| 5,057,888 | 10/1991 | Fazan et al. | 257/303 |
| 5,124,765 | 6/1992 | Kim et al. | 257/309 |
| 5,363,326 | 11/1994 | Nakajima | 365/149 |
| 5,770,874 | 6/1998 | Egawa | 257/296 |

*Primary Examiner*—Jerome Jackson, Jr.
*Assistant Examiner*—George C. Eckert, II
*Attorney, Agent, or Firm*—Conley, Rose & Tayon, PC; B. Noel Kivlin

[57] ABSTRACT

A memory device is presented including a memory array having both trench capacitor and stacked capacitor DRAM cells. The trench and stacked capacitor DRAM cells are arranged in a configuration which achieves increased cell density while providing adequate electrical isolation between cells. The increased density of the memory array results in an increase in operational performance and a decrease in cost on a per storage bit basis. The memory array includes electrically conductive bit and word lines. The bit lines are arranged in vertical columns. The trench capacitor DRAM cells are arranged in pairs and aligned along the bit lines. Each pair of trench capacitor DRAM cells shares a common electrical contact to the bit line to which the pair is aligned. Capacitors of the stacked capacitor DRAM cells may be formed above the bit lines. A portion of the word lines are arranged in horizontal rows substantially orthogonal to the bit lines, and the remainder of the word lines are arranged in vertical columns and interleaved with the bit lines. The stacked capacitor DRAM cells are formed between the word lines arranged in rows, and are organized in pairs. Each pair of stacked capacitor DRAM cells shares a common electrical contact to an adjacent bit line. Each of the word lines arranged in rows forms a gate electrode of trench capacitor DRAM cells, and each of the word lines arranged in columns forms the gate electrode of stacked capacitor DRAM cells.

15 Claims, 7 Drawing Sheets

MEMORY DEVICE INCLUDING A MEMORY ARRAY HAVING A COMBINATION OF TRENCH CAPACITOR DRAM CELLS AND STACKED CAPACITOR DRAM CELLS

BACKGROUND OF THE INVENTION

1. Field of the Invention

This invention relates to computer memory systems, and more particularly to the manufacture of semiconductor memory devices.

2. Description of the Related Art

Personal computers, workstations, and graphics subsystems include memory systems for storing data. An ever increasing demand exists for larger and faster memory systems. Attributes of memory technologies include data access time (i.e., "speed"), cost, reliability, size (i.e., density), and electrical power dissipation. Semiconductor dynamic random access memory (DRAM) represents an acceptable compromise for many applications, and is commonly used in memory systems.

The basic unit of DRAM is the memory cell. Several different types of DRAM cells exist, each having a number of transistors arranged in different configurations. The most popular DRAM cell is the one-transistor cell which allows the highest density. FIG. 1 is a circuit diagram of a typical one-transistor DRAM cell 10. DRAM cell 10 includes a metal oxide semiconductor (MOS) "transfer" transistor 12 coupled to a charge storage capacitor 14. DRAM cell 10 stores a binary digit (i.e., bit) of data as a quantity of electrical charge upon capacitor 14.

Transistor 12 has a drain terminal connected to a "bit" line 16, a gate terminal connected to a "word" line 18, and a source terminal connected to one of two terminal of capacitor 14. The other terminal of capacitor 14 is connected to a "plate" conductor 20. Plate conductor 20 is connected to a fixed electrical potential (e.g., an electrical ground potential $V_{SS}$, an electrical power supply voltage $V_{DD}$, etc.). Transistor 12 ac a switch, allowing a transfer or "flow" of charge carriers (i.e.., electrons) between capacitor 14 and bit line 16 when activated via a voltage driven upon word line 18. In order to "read" the data stored within DRAM cell 10, a sense amplifier (i.e., sense amp) connected to the bit line is typically used to detect voltage fluctuations on the bit line as a result of a transfer of charge between capacitor 14 and bit line 16.

In DRAM cell 10, a relatively large amount of electrical charge stored upon capacitor 14 represents a stored logic "1", and a relatively small amount of charge stored upon capacitor 14 represents a stored logic "0". The charge stored upon capacitor 14 decays with time due to various "leakage" currents (e.g., through transistor 12: gate structure, source/drain parasitic junctions, and isolation structures). The amount of time capacitor 14 retains a quantity of charge required to distinguish a logic "1" from a logic "0" typically ranges from tens of milliseconds to hundreds of milliseconds. A periodic "refresh" is therefore necessary to restore the charge stored upon capacitor 14.

A photolithographic process is typically used to form DRAM cell elements upon an upper surface of a semiconductor substrate. Continuing advances in photolithographic processes have allowed a reduction in the physical dimensions of DRAM cell elements in two dimensions (i.e., an X-Y plane of the upper surface of the semiconductor substrate). Several factors influence the required charge storing capacity (i.e., the capacitance) of capacitor 14, including the sensitivity of the sense amp, data retention time, and the ability to retain data despite "single-event upsets" due to alpha particles and cosmic rays. Due to these factors, the required capacitance of capacitor 14 has remained relatively constant. As the capacitance of a particular capacitor structure is directly dependent upon the volume the capacitor occupies, the volume of capacitor 14 has remained relatively constant despite X-Y dimension reduction capability afforded by photolithographic advances.

The desire to increase DRAM cell density has led many to form capacitor 14 above or below the surface of the semiconductor substrate (i.e., in the Z dimension normal to the surface, forming three-dimensional or "3-D" DRAM cells). Such 3-D DRAM cells typically include "trench" capacitors formed under the surface of the semiconductor substrate, or "stacked" capacitors formed above the surface of the substrate.

FIG. 2 is a cross-sectional view of a typical trench capacitor DRAM cell 30. In order to form the DRAM cell capacitor, material is removed from a region near an upper surface of substrate 32, forming a trench. Substrate 32 is predominantly semiconductor material heavily doped with an n-type impurity (i.e., n+), and has an upper epitaxial layer of p-type material. The trench extends through the p-type epitaxial layer and into the n+ bulk. The trench is lined with a dielectric layer 34, then filled with an electrically conductive fill material 36 (e.g., n+ polycrystalline silicon, or n+ poly-Si). A relatively thick insulating collar 38 may be formed along a sidewall of the trench.

The transfer transistor of DRAM cell 30 is an MOS transistor including a n+ drain region 40 and a n+ source region 42 formed within the p-type epitaxial layer. A dielectric layer 46 separates an electrically conductive word line 48 from drain region 40 and source region 42. The portion of word line 48 passing over drain region 40 and source region 42 functions as a gate electrode of the transfer MOS transistor. A bit line 50 extends downward through a dielectric layer 52 to make contact with n+ drain region 40. A shallow trench isolation (STI) region 54 may be formed around an upper potion of the trench.

The electrically conductive fill material 36 within the trench makes electrical contact with n+source region 42, and forms one "plate" of the capacitor of DRAM cell 30. The other plate of DRAM cell capacitor 30 is the underlying n+ bulk of substrate 32. The n+ bulk of substrate 32 is connected to a fixed electrical potential (e.g., $V_{DD}$ or $V_{SS}$). Dielectric layer 34 separates the two plates of DRAM cell capacitor 30.

FIG. 3 is a cross-sectional view of a typical capacitor over bit line (COB) stacked capacitor DRAM cell 60. In DRAM cell 60, the capacitor is formed above the surface of a p-type substrate 62, and above a bit line 64. The transfer transistor of DRAM cell 60 is an MOS transistor including an n+ drain region 66 and an n+ source region 68 formed within p-type substrate 62. A dielectric layer 70 separates an electrically conductive word line 72 from drain region 66 and source region 68. The portion of word line 72 passing over drain region 66 and source region 68 functions as a gate electrode of the transfer MOS transistor. Bit line 64 extends downward through a dielectric layer 74 to make contact with n+ drain region 66.

An electrically conductive block 76 formed above bit line 64 is connected to n+ source region 68 by an electrically conductive pillar 78. Block 76 may be formed from, for example, n+ poly-Si. Pillar 78 electrically connects block 76 to n+ source region 68, and extends through a dielectric layer 80, between bit line 64 and block 76, and dielectric layer 74 between bit line 64 and word line 72. A dielectric layer 82 is formed over block 76, and an electrically conductive plate conductor 84 is formed over dielectric layer 82. Block 76 is one plate of the capacitor of DRAM cell 60, and makes electrical contact with n+ source region 68. The other plate of the DRAM cell capacitor is plate conductor 84.

FIG. 4 is a top plane view of a portion of a typical layout of a two-dimensional array of trench capacitor DRAM cells 90 within a memory device. Bit lines labeled "bm" define vertical columns of the array, when m is an integer index. Word lines labeled "wxn" define horizontal rows of the array, when n is an integer index. Capacitors of the array are represented by oblong squares and labeled "cnm", where each capacitor is associated with word line "wxn" and a bit line "bm". Portions of word lines "wxn" functioning as gate electrodes of transfer transistors are represented by the symbol "x". Electrical contacts extending downward from the bit lines to the drain regions of the transfer transistors are represented by small ovals along the bit lines. DRAM cells 90 are arranged in adjoining pairs aligned along the bit line columns, and share common bit line electrical contacts.

The cost of manufacturing a semiconductor memory device is directly proportional to the size of the substrate (i.e., die). It would thus be desirable to have a memory device including a larger number of DRAM cells per unit of substrate surface area (i.e., having an increased DRAM cell density). Such an increase in cell density would allow more data storage per unit of substrate surface area, reducing the manufacturing cost of the memory device per bit of data storage.

SUMMARY OF THE INVENTION

The problems outlined above are in large part solved by a memory device including a memory array having a combination of trench capacitor DRAM cells and stacked capacitor DRAM cells. The trench capacitor DRAM cells are formed beneath a planar surface of a monolithic semiconductor substrate (i.e., in a −Z direction), and the stacked capacitor DRAM cells are formed above the planar surface of the substrate (i.e., in a +Z direction). The trench and stacked capacitor DRAM cells are arranged in a configuration which achieves increased cell density while providing adequate electrical isolation between cells.

The memory array includes electrically conductive bit lines and word lines. The bit lines are arranged in vertical columns, and may be formed from a metal (e.g., aluminum). The trench capacitor DRAM cells are arranged in pairs and aligned along the bit lines. Each pair of trench capacitor DRAM cells shares a common electrical contact to the bit line to which the pair is aligned. The capacitors of the stacked capacitor DRAM cells may be formed above the bit lines.

A portion of the word lines are arranged in horizontal rows substantially orthogonal to the bit lines, and the remainder of the word lines are arranged in vertical columns and interleaved with the bit lines. The word lines may be formed from a material including poly-Si (e.g., doped poly-Si). The stacked capacitor DRAM cells are formed between the word lines arranged in rows, and are arranged in pairs. Each pair of stacked capacitor DRAM cells shares a common electrical contact to an adjacent bit line.

Each DRAM cell has a transfer transistor (e.g., an MOS transistor) coupled to a capacitor which stores an electrical charge. Each transfer transistor has a gate electrode which controls a flow of electrical charge through the transfer transistor. Each of the word lines arranged in rows forms the gate electrode of members of the trench capacitor DRAM cells, and each of the word lines arranged in columns forms the gate electrode of the stacked capacitor DRAM cells.

BRIEF DESCRIPTION OF THE DRAWINGS

Other objects and advantages of the invention will become apparent upon reading the following detailed description and upon reference to the accompanying drawings in which.

Figure 1:
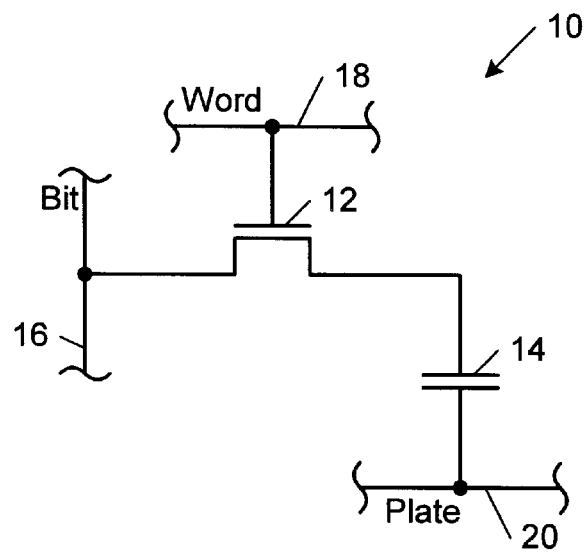
FIG. 1 is a circuit diagram of a typical one-transistor DRAM cell.
Figure 2:
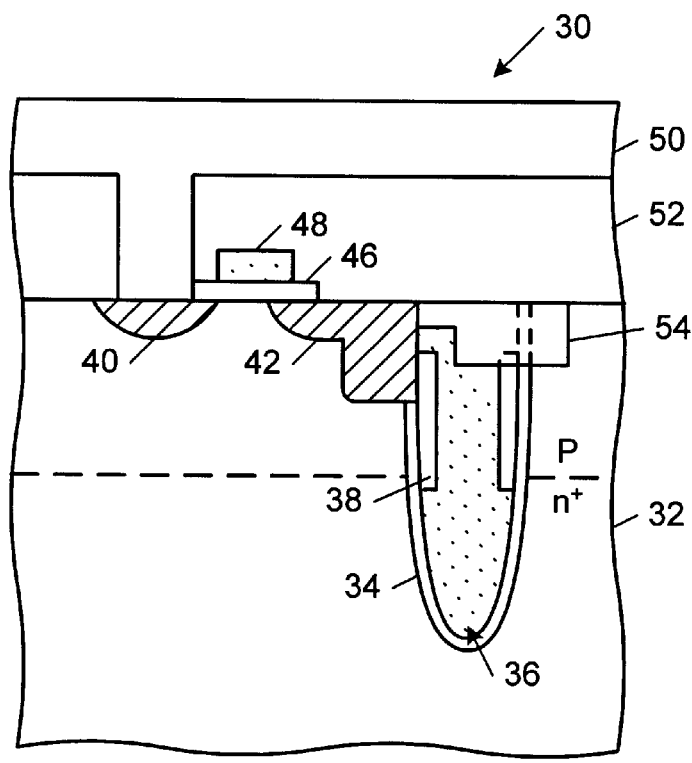
FIG. 2 is a cross-sectional view of a typical trench capacitor DRAM cell.
Figure 3:
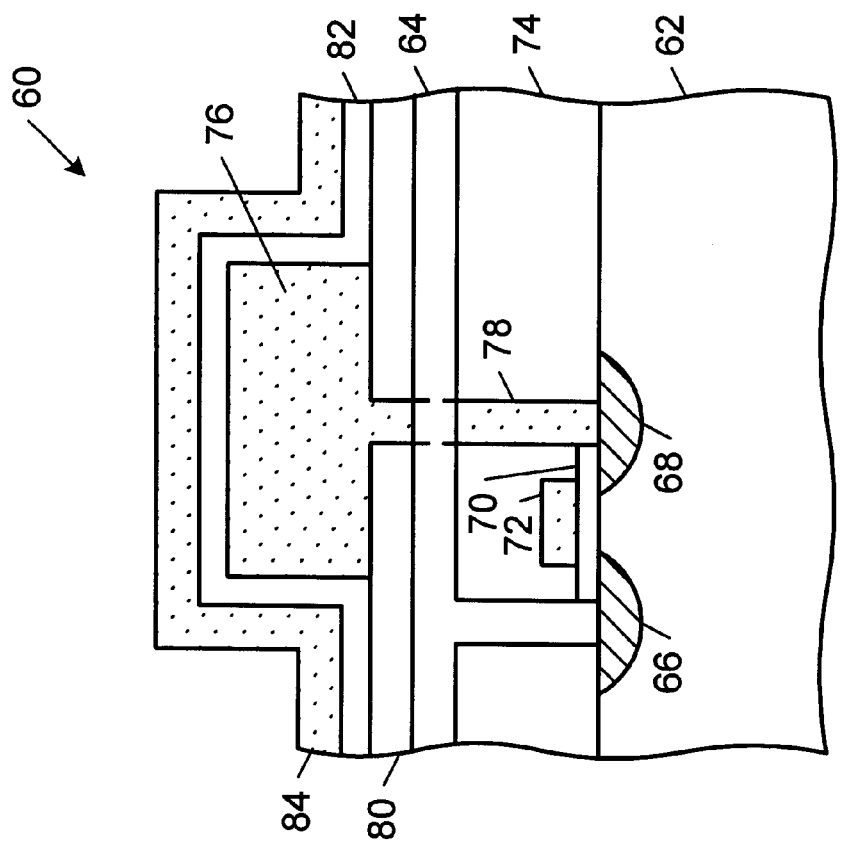
FIG. 3 is a cross-sectional view of a typical capacitor over bit line (COB) stacked capacitor DRAM cell.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 5:
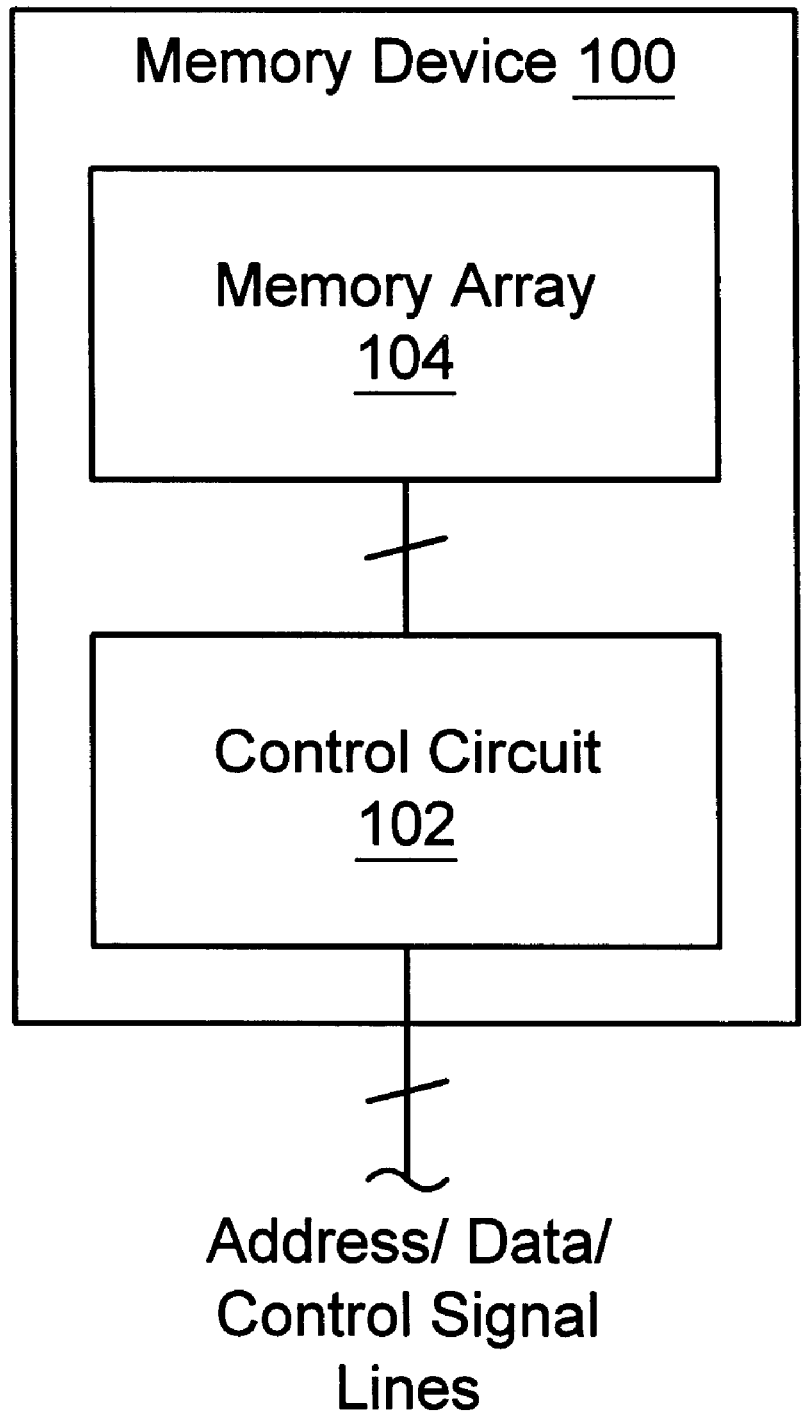
FIG. 5 is a block diagram of one embodiment of a memory device according to the present invention, wherein the memory device includes a control circuit and a memory array.

FIG. 5 is a block diagram of one embodiment of a memory device 100 according to the present invention. Memory device 100 includes a control circuit 102 coupled to a memory array 104. Control circuit 102 and memory array 104 may be formed upon a substantially planar surface of a monolithic semiconductor substrate. Control circuit 102 receives address and control signals. Control circuit 102 receives data signals during data write operations, and provides data signals during data read operations. Control circuit 102 may include, for example, latches, decoders, sense amplifiers, clock signal generators, and multiplexers used to store data within and retrieve data from memory array 104.

Figure 6:
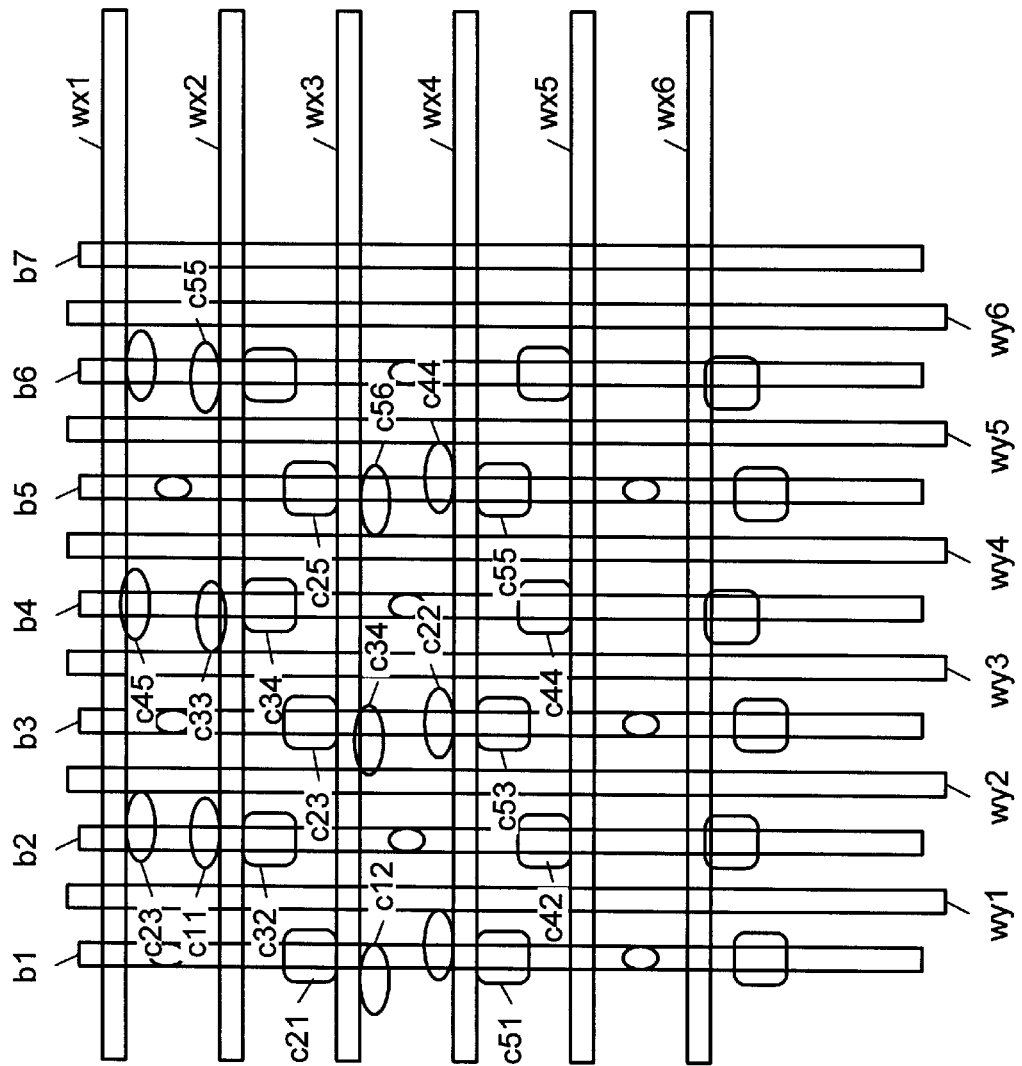
FIG. 6 is a top plane view of a portion of a layout of the memory array of FIG. 5 illustrating an arrangement of charge storage capacitors according to one embodiment of the present invention, wherein the memory array includes trench capacitor DRAM cells and stacked capacitor DRAM cells.

FIG. 6 is a top plane view of a portion of a layout of memory array 104 illustrating an arrangement of charge storage capacitors according to one embodiment of the present invention. Memory array 104 includes multiple DRAM cells arranged as an array. Each DRAM cell is a one-transistor DRAM cell, and includes a transfer transistor coupled to a charge storage capacitor. The transfer transistor may be an MOS transistor having a gate electrode separated from source and drain regions in the substrate by a dielectric layer. The capacitor is used to store an electrical charge, wherein the amount of charge stored upon the capacitor is indicative of the value of a stored binary digit (i.e., bit). The transfer transistor controls a flow of electrical charge carriers to and from the capacitor.

Memory array 104 includes multiple electrically conductive bit lines and word lines. Bit lines labeled "bm" form vertical columns of the array, where m is an integer index. A portion of the word lines, labeled "wxn" where n is an integer index, define horizontal rows of the array. Word lines "wxn" are substantially orthogonal to bit lines "bm". The remainder of the word lines, labeled "wyo" where o is an integer index, are interleaved with the bit lines and form vertical columns of the array. Bit lines "bm" may be formed from, for example, a metal (e.g., aluminum, tungsten, etc.) or a metal suicide (e.g., tungsten silicide). Bit lines "bm" may also be formed from a material containing poly-Si (e.g., doped ploy-Si). Word lines "wxn" and "wyo" may be formed from, for example, a material containing poly-Si (e.g., doped ploy-Si). The word lines and bit lines are formed above the surface of the semiconductor substrate and may be insulated from one another via dielectric layers.

A portion of the DRAM cells in memory array 104 include trench capacitors formed beneath the surface of the semiconductor substrate, and the remainder of the DRAM cells include stacked capacitors formed above the surface of the semiconductor substrate. The stacked capacitors may be formed above bit lines "bm". In FIG. 6, trench capacitors are represented by oblong squares and labeled "cnm", where each trench capacitor is associated with a word line "wxn" and a bit line "bm". Stacked capacitors are represented by the larger ovals between word lines "wxn", and are labeled "c'om", where each stacked capacitor is associated with a word line "wyo" and a bit line "bm".

The use of stacked capacitors allows an increase in the density of memory device 100. Trench capacitors must normally be separated by a certain amount of distance to achieve adequate electrical isolation. Similarly, stacked capacitors also require a certain amount of physical separation to achieve adequate electrical isolation. The use of both trench and stacked capacitors within memory array 104 advantageously allows the density of the DRAM cells to be increased while achieving adequate electrical isolation. Electrical isolation is achieved with less physical separation than would otherwise be necessary if all of the capacitors were trench capacitors, or if all of the capacitors were stacked capacitors.

Figure 7:
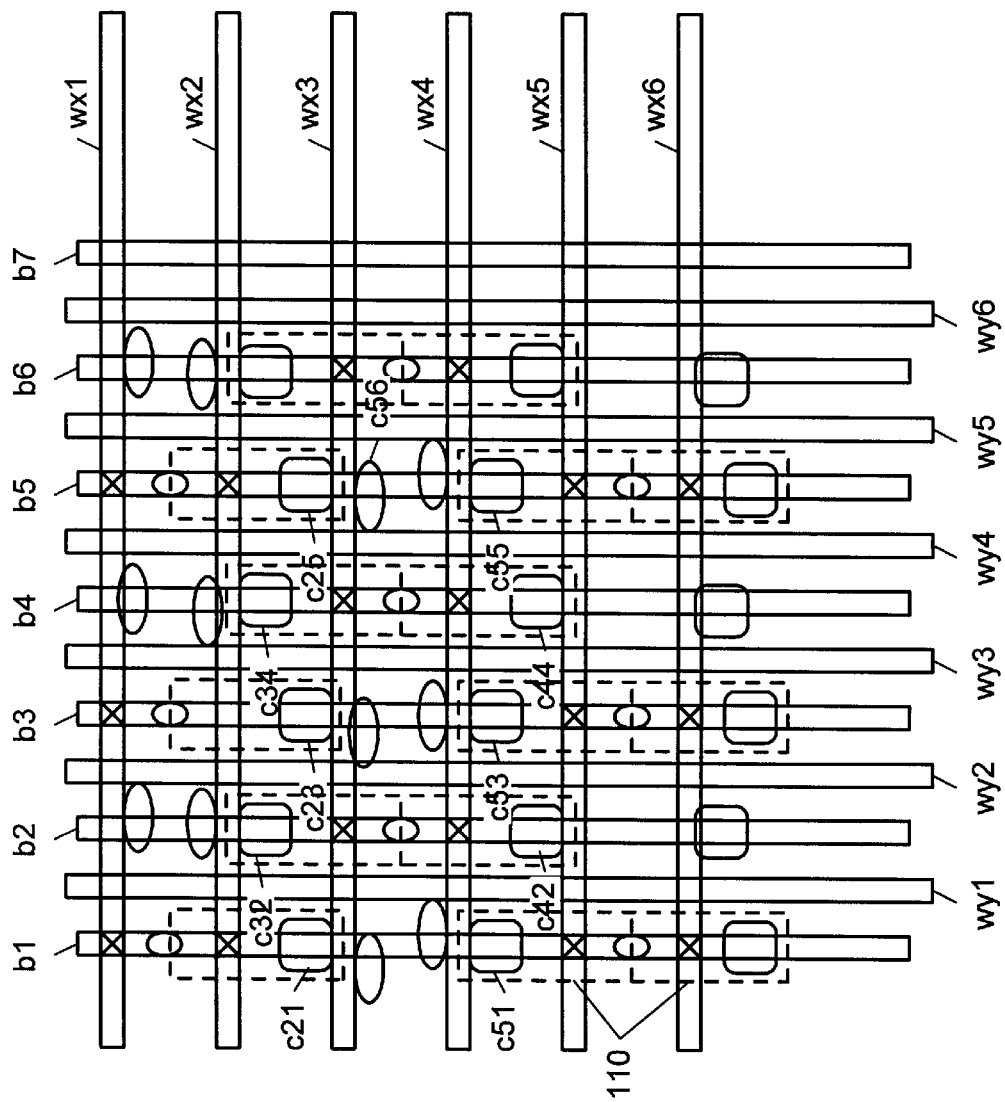
FIG. 7 is a top plane view of the layout of FIG. 6 highlighting those features pertaining to the trench capacitor DRAM cells.

FIG. 7 is a top plane view of the layout of FIG. 6 highlighting those features pertaining to trench capacitor DRAM cells 110. Trench capacitor DRAM cells 110 are organized in pairs and aligned along bit lines "bm". Portions of word lines "wxn" functioning as gate electrodes of transfer transistors are represented by the symbol "x". Each pair of trench capacitor DRAM cells 110 shares a common electrical contact to the bit line "bo" to which they are aligned. The electrical contacts are represented in FIG. 7 by small ovals along the bit lines.

Figure 8:
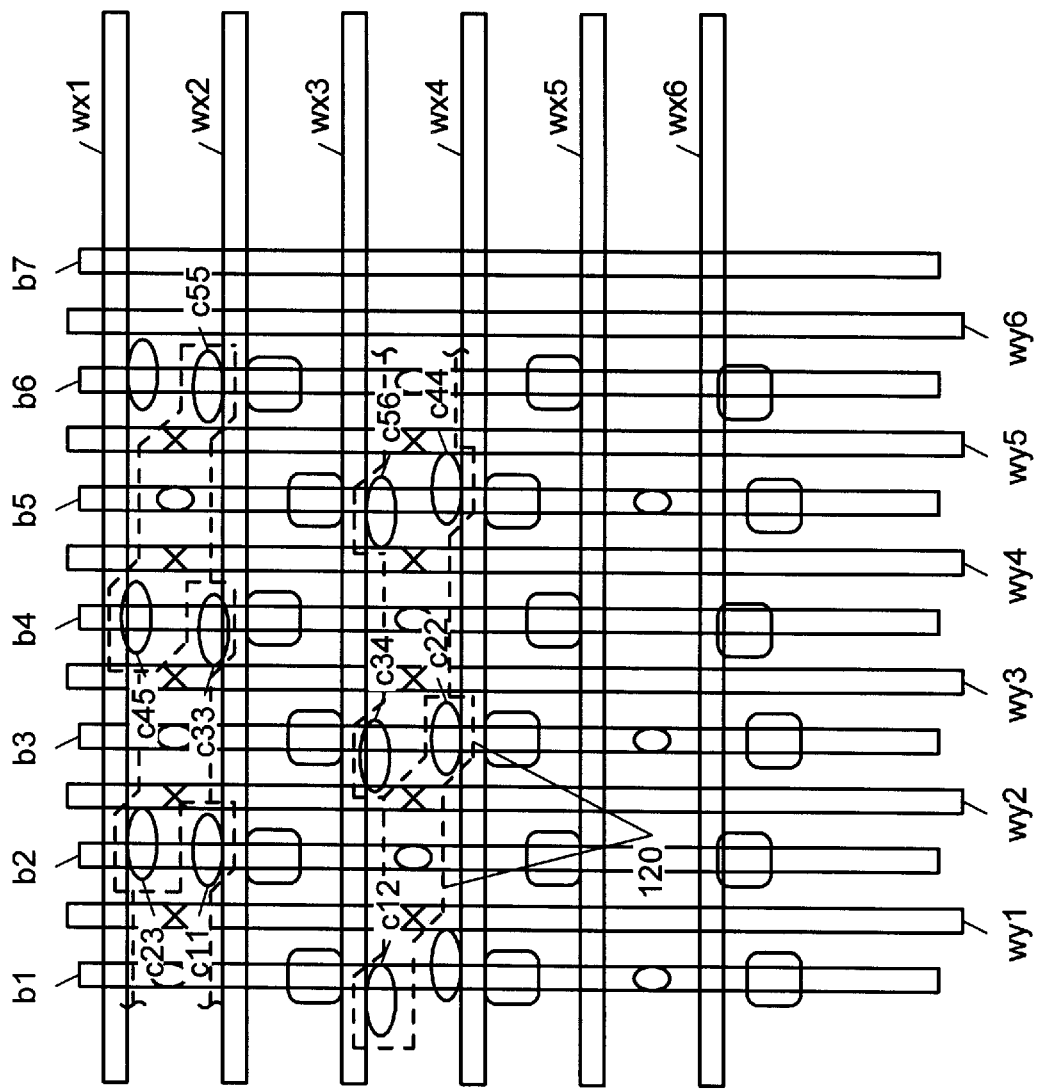
FIG. 8 is a top plane view of the layout of FIG. 6 highlighting those features pertaining to the stacked capacitor DRAM cells.

FIG. 8 is a top plane view of the layout of FIG. 6 highlighting those features pertaining to stacked capacitor DRAM cells 120. Stacked capacitor DRAM cells 120 are formed between the portion of the word lines labeled "wxn" and defining horizontal rows. Stacked capacitor DRAM cells 120 are organized in pairs as are trench capacitor DRAM cells 110. Portions of word lines "wyo" functioning as gate electrodes of transfer transistors are represented by the symbol "x". Each pair of trench capacitor DRAM cells 110 shares a common electrical contact to a bit line. The electrical contacts are represented in FIG. 8 by small ovals along the bit lines.

Viewing FIGS. 7 and 8 in combination, it is noted that four DRAM cells share a common electrical contact to a bit line: a pair of trench capacitor cells (with capacitors in the −Z direction) and a pair of stacked capacitor cells (with capacitors in the +Z direction). The pair of trench capacitor cells are controlled by wxn word lines running horizontally, and the pair of stacked capacitor cells are controlled by wyo word lines running vertically. The use of both trench and stacked capacitors within memory array 104 allows an increase in the density of memory array 104.

Figure 4:
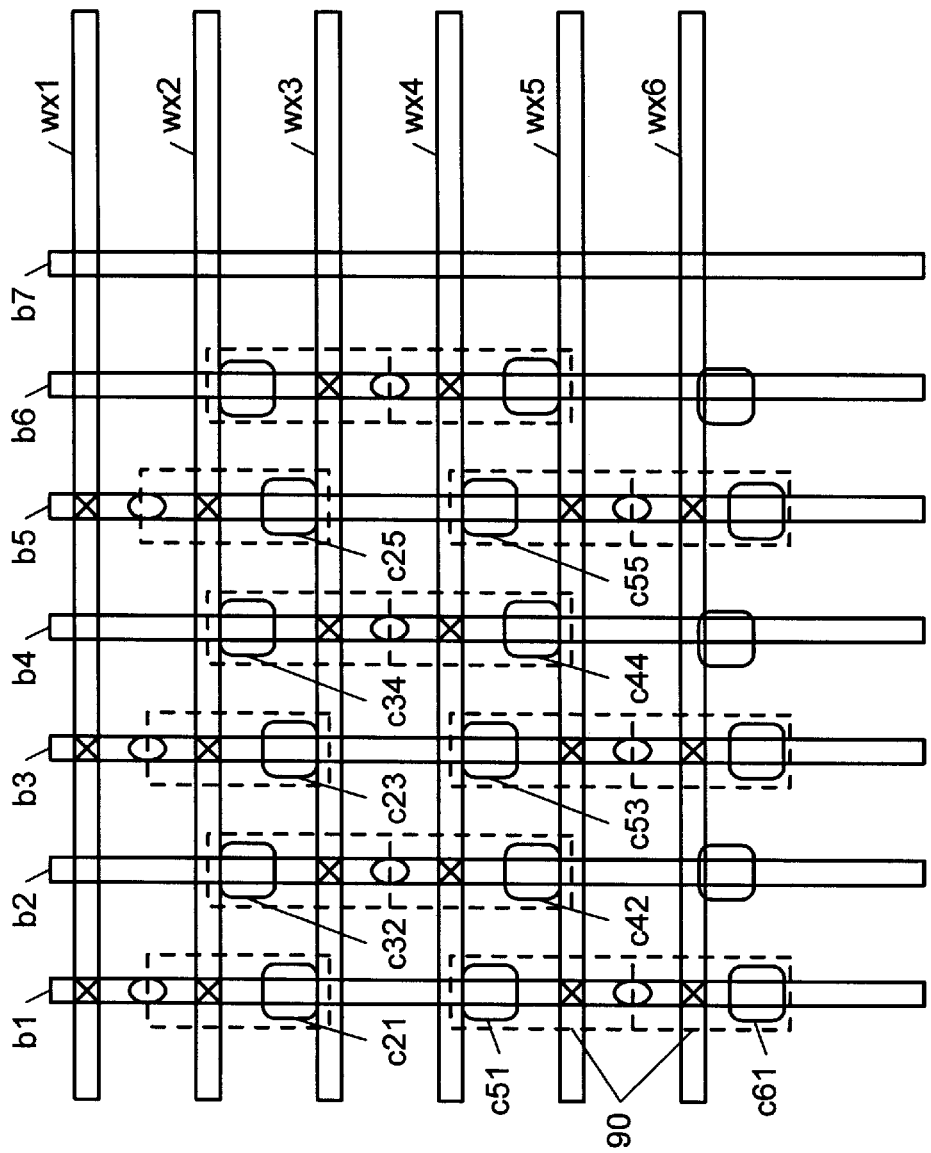
FIG. 4 is a top plane view of a portion of a typical layout of a two-dimensional array of trench capacitor DRAM cells within a memory device.

In implementing the layout of memory array 104 as described above, the number of DRAM cells per bit line may be doubled over the layout of FIG. 4. Doubling the number of cells per bit line achieves a larger but operationally "slower" implementation. It is also possible to half the length of each bit line in order to maintain an original number of DRAM cells in the memory array and an original number of cells per bit line. In this case, the resulting implementation occupies a smaller substrate surface area and is operationally "faster". In both cases the density of the memory array is increased, resulting in an increase in operational performance and a decrease in cost on a per storage bit (i.e., DRAM cell) basis.

It is noted that while pairs of trench capacitor DRAM, cells are described and shown, it is contemplated that three or more trench capacitor DRAM cells may be grouped together and share a common electrical connection to a bit line. Similarly, it is contemplated that three or more stacked capacitor DRAM cells may be grouped together and share a common electrical connection to a bit line. Furthermore, one or more of the trench capacitor DRAM cell groupings and one or more of the stacked capacitor DRAM cell groupings may share a common electrical connection to a bit line.

Numerous variations and modifications will become apparent to those skilled in the art once the above disclosure is fully appreciated. It is intended that the following claims be interpreted to embrace all such variations and modifications.

What is claimed is:

1. A memory device, comprising:
   an array of memory cells;
   a plurality of bit lines for transferring data stored within said array of memory cells;
   a plurality of word lines coupled to enable read and write accesses within said array of memory cells;
   wherein said array of memory cells includes a first plurality of memory cells coupled to said plurality of bit lines and said plurality of word lines, and wherein each of said first plurality of memory cells includes a trench capacitor coupled to a corresponding transfer transistor, and wherein each transfer transistor of said first plurality of memory cells includes a source region and a drain region aligned in a first direction with respect to one another; and
   wherein said array of memory cells includes a second plurality of memory cells coupled to said plurality of bit lines and said plurality of word lines, and wherein each of said second plurality of memory cells includes a stacked capacitor coupled to a corresponding transfer transistor, and wherein each transfer transistor of said second plurality of memory cells includes a source region and a drain region aligned in a second direction with respect to one another, and wherein said second direction is substantially orthogonal to said first direction.

2. The memory device as recited in claim 1, wherein the trench capacitors of said first plurality of memory cells are formed within a semiconductor substrate.

3. The memory device as recited in claim 2, wherein said plurality of bit lines and said plurality of word lines are formed above a planar surface of the semiconductor substrate.

4. The memory device as recited in claim 3, wherein the stacked capacitors of said second plurality of memory cells are formed above said plurality of bit lines and said plurality of word lines.

5. The memory device as recited in claim 2, wherein the source and drain regions of the transfer transistors of said first and second pluralities of memory cell are formed within the semiconductor substrate.

6. The memory device as recited in claim 1, wherein said plurality of bit lines are parallel to one another and extend in the first direction.

7. The memory device as recited in claim 6, wherein said plurality of word lines includes a first subset extending in the first direction and a second subset extending in the second direction.

8. The memory device as recited in claim 7, wherein the first subset of said plurality of word lines are interleaved with said plurality of bit lines.

9. The memory device as recited in claim 7, wherein the first subset of said plurality of word lines enable read and write accesses to said second plurality of memory cells having stacked capacitors, and wherein the second subset of said plurality of word lines enable read and write accesses to said first plurality of memory cells having trench capacitors.

10. The memory device as recited in claim 1, wherein said first plurality of memory cells are arranged in paired sets within the memory array, and wherein each paired set of said first plurality of memory cells shares a common electrical contact to one of said plurality of bit lines.

11. The memory device as recited in claim 10, wherein said second plurality of memory cells are arranged in paired sets within the memory array, and wherein each paired set of said second plurality of memory cells shares a common electrical contact to one of said plurality of bit lines.

12. The memory device as recited in claim 11, wherein each paired set of said first plurality of memory cells shares a common electrical contact to one of said plurality of bit lines with a paired set of said second plurality of memory cells.

13. The memory device as recited in claim 1, wherein said plurality of bit lines are formed from an electrically conductive material comprising a metal.

14. The memory device as recited in claim 1, wherein said plurality of bit lines are formed from an electrically conductive material comprising polycrystalline silicon.

15. The memory device as recited in claim 1, wherein said plurality of word lines are formed from an electrically conductive material comprising polycrystalline silicon.

* * * * *